(12) United States Patent
Kim et al.

(10) Patent No.: US 6,931,345 B1
(45) Date of Patent: Aug. 16, 2005

(54) METHOD FOR QUANTIFYING SAFE OPERATING AREA FOR BIPOLAR JUNCTION TRANSISTOR

(75) Inventors: Jonggook Kim, San Jose, CA (US); Yun Liu, Sunnyvale, CA (US); Joseph A. De Santis, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 110 days.

(21) Appl. No.: 10/688,550

(22) Filed: Oct. 17, 2003

(51) Int. Cl.$^7$ .......................... G01R 27/28; H01L 29/72
(52) U.S. Cl. ................. 702/117; 257/139; 257/335; 257/378; 257/592; 438/268
(58) Field of Search ...................... 702/57, 64, 65, 702/107, 108, 117–118; 257/132, 139, 153, 257/335, 375, 378, 592; 438/268; 327/375; 361/101

(56) References Cited

U.S. PATENT DOCUMENTS

| | | | |
|---|---|---|---|
| 4,823,176 A | * | 4/1989 | Baliga et al. ............... 257/335 |
| 4,941,030 A | * | 7/1990 | Majumdar .................. 257/378 |
| 5,557,139 A | * | 9/1996 | Palara ........................ 257/592 |
| 5,909,039 A | * | 6/1999 | Bakowski et al. .......... 257/139 |
| 6,121,089 A | * | 9/2000 | Zeng et al. ................. 438/268 |
| 6,405,148 B1 | * | 6/2002 | Hayashi et al. ............. 702/117 |

OTHER PUBLICATIONS

Michael G. Adlerstein, Thermal Stability of Emitter Ballasted HBT's, IEEE Transaction on Electron Devices, Aug. 1998, pp. 1653-1655, vol. 45, No. 8.

* cited by examiner

Primary Examiner—John Barlow
Assistant Examiner—John Le
(74) Attorney, Agent, or Firm—Vedder Price Kaufman & Kammholz, P.C.

(57) ABSTRACT

A method for quantifying safe operating regions within a safe operating area (SOA) for a bipolar junction transistor (BJT) by driving the device under test (DUT) as part of a current mirror circuit and monitoring variances in the current mirror ratio for various biasing conditions.

12 Claims, 5 Drawing Sheets

METHOD FOR QUANTIFYING SAFE OPERATING AREA FOR BIPOLAR JUNCTION TRANSISTOR

BACKGROUND OF THE INVENTION

1. Field of the Invention

The present invention relates to characterization techniques for transistor designs, and in particular, to methods for identifying safe operating areas (SOAs) for bipolar junction transistors (BJTs).

2. Description of the Related Art

High-speed bipolar transistor circuit designs have been implementing the BJTs as silicon-on-insulator (SOI) devices so as to reduce parasitic effects and improving packing densities. However, compared to conventional bulk silicon BJTs, such implementations suffer from heat dissipation problems due to the high thermal resistance mainly caused by the silicon island being surrounded by trench isolation and buried oxides.

As circuit operating currents and bias voltages have increased, thermal instability has become a significant issue for reliability of high performance SOI BJTs. Accordingly, circuit designers rely significantly upon device characterizations establishing SOAs for such devices. As is well known in the art, the conventional techniques for establishing the SOA for a power BJT is to test discrete transistors in fixed single modes which are generally described as voltage (Vbe) controlled mode and current (Ibe) controlled mode.

Referring to FIG. 1A, a typical voltage controlled mode of test for a BJT has the transistor Q connected in a common base configuration, i.e., with the base electrode grounded, and collector Vcc and emitter Vee bias voltages applied at the collector and emitter terminals, respectively. The voltage at the emitter terminal is controlled so as to provide a controllable base-emitter voltage Vbe. The collector voltage supply Vcc is also controlled so as to provide a variable collector-emitter voltage Vce.

Referring to FIG. 1B, such a voltage controlled mode, absent current limiting within the collector power supply Vcc, will bring about thermal runaway due to destructive feedback between current and temperature within the transistor Q, along with an abrupt drop in current gain (beta) at a particular base emitter voltage Vbe. Around the critical base emitter voltage Vbe (generally between 0.8 and 0.9 volts), the current within the transistor Q causes the temperature to rise. This, in turn, stimulates a further increase in the current, which induces a further temperature rise. This process repeats until the transistor fails (or the current limit established in the collector power supply Vcc is reached). The onset base emitter voltage Vbe (i.e., the voltage at which the abrupt current gain decrease occurs) and emitter current density Je for thermal runaway decrease as the collector emitter voltage Vce increases.

Referring to FIG. 2A, for the current controlled mode, the transistor Q is again connected in a common base configuration and with a controllable collector bias voltage Vcc supply. In this mode, the emitter is driven by a current source Iee which is controllable to provide a variable emitter current Ie which, in turn, causes a variable base current Ib and base emitter voltage Vbe to be generated.

Referring to FIG. 2B, in the current controlled mode, as the bias current Ie is increased, thereby causing the collector current Ic to increase, the base emitter voltage Vbe will increase to a point and then decrease, thereby indicating a negative resistance in the high power region of operation. However, with no spontaneous feedback between voltage and temperature for a fixed current Ie, the transistor Q may not fail. The onset base emitter voltage Vbe and emitter current density Je for negative resistance both decrease as the collector emitter voltage Vce increases.

Referring to FIG. 3, as a result of these voltage controlled and current controlled mode tests, the safe operating areas for the transistor Q can be established based upon the thermal runaway modes (FIGS. 1A and 1B) and negative resistance modes (FIGS. 2A and 2B) as a function of the collector-emitter voltage Vce bias. For this particular example (NPN transistor with a 40 square micrometer emitter area Ae), the critical current density Je (in milliamps per square micrometer) for the thermal runaway condition is half of that for the negative resistance condition.

SUMMARY OF THE INVENTION

In accordance with the presently claimed invention, a method is provided for quantifying safe operating regions within a safe operating area (SOA) for a bipolar junction transistor (BJT) by driving the device under test (DUT) as part of a current mirror circuit and monitoring variances in the current mirror ratio for various biasing conditions.

In accordance with one embodiment of the presently claimed invention, a method for quantifying a plurality of safe operating regions within a safe operating area (SOA) for a bipolar junction transistor (BJT) includes:

providing a current mirror circuit with mutually coupled first and second BJTs, wherein
  the first BJT includes a base electrode, a collector electrode and an emitter electrode with an area,
  the second BJT includes a base electrode, a collector electrode and an emitter electrode with an area, and
  the second BJT emitter area is greater than the first BJT emitter area;
applying an inter-electrode voltage with a plurality of values to first and second ones of the second BJT electrodes;
applying a first current with a plurality of values to at least one of the first BJT electrodes;
measuring a plurality of values of a second current through one of the second BJT electrodes corresponding to a plurality of combinations of the pluralities of inter-electrode voltage and first current values;
computing a plurality of electrode current densities corresponding to a plurality of ratios of the plurality of second current values and the second BJT emitter electrode area;
computing a plurality of ratios of the second and first current values corresponding to at least a portion of the plurality of combinations of the pluralities of inter-electrode voltage and first current values;
computing a plurality of ratio errors corresponding to a plurality of differences between each one of the plurality of second and first current ratios and a reference current ratio; and
generating a plurality of contours corresponding to the plurality of electrode current densities as functions of the plurality of inter-electrode voltage values for the plurality of ratio errors.

In accordance with another embodiment of the presently claimed invention, a method for quantifying a plurality of safe operating regions within a safe operating area (SOA) for a bipolar junction transistor (BJT) includes:

providing a plurality of transistor model data for first and second BJTs, wherein the first BJT includes a base electrode, a collector electrode and an emitter electrode with an area, the second BJT includes a base electrode, a collector electrode and an emitter electrode with an area, and the second BJT emitter area is greater than the first BJT emitter area;

simulating a current mirror circuit with the plurality of transistor model data, wherein the first and second BJTs are mutually coupled;

simulating an application of an inter-electrode voltage with a plurality of values to first and second ones of the second BJT electrodes;

simulating an application of a first current with a plurality of values to at least one of the first BJT electrodes;

computing a plurality of values of a second current through one of the second BJT electrodes corresponding to a plurality of combinations of the pluralities of inter-electrode voltage and first current values;

computing a plurality of electrode current densities corresponding to a plurality of ratios of the plurality of second current values and the second BJT emitter electrode area;

computing a plurality of ratios of the second and first current values corresponding to at least a portion of the plurality of combinations of the pluralities of inter-electrode voltage and first current values;

computing a plurality of ratio errors corresponding to a plurality of differences between each one of the plurality of second and first current ratios and a reference current ratio; and generating a plurality of contours corresponding to the plurality of electrode current densities as functions of the plurality of inter-electrode voltage values for the plurality of ratio errors.

DETAILED DESCRIPTION OF THE INVENTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Figure 4:
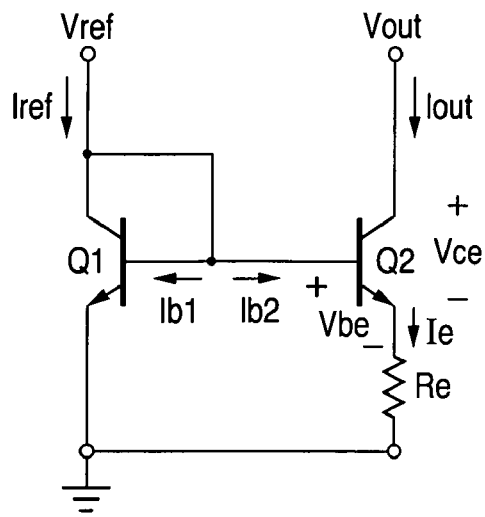
FIG. 4 is a schematic diagram for a current mirror test circuit for characterizing a BJT in accordance with one embodiment of the presently claimed invention.

Referring to FIG. 4, in accordance with the presently claimed invention, a current mirror circuit implemented with an input, or reference, transistor Q1 and output transistor Q2, with the output transistor Q2 as the device under test (DUT), is used to establish the SOA for the output transistor Q2. With the base electrodes mutually connected and connected to the collector terminal of the reference transistor Q1, a reference voltage Vref and reference current Iref are applied to the collector electrode of transistor Q1. This establishes the base currents Ib1, Ib2 for the transistors Q1, Q2. The output base current Ib2, in turn, establishes the output current Iout through the collector electrode of transistor Q2, as well as the emitter current Ie through the emitter electrode of transistor Q2. An output voltage Vout is applied at the collector electrode of transistor Q2, and is variable so as to provide variable values of the collector-emitter voltage Vce across transistor Q2.

By driving the DUT transistor Q2 in a current mirror configuration, thermal decoupling is accomplished and a small input current Iref through a small input transistor Q1 (e.g., with two or five square micrometers emitter area Ae) to generate a large output current Iout through a large output transistor Q2 (e.g., with 40, 80 or 320 square micrometers emitter area Ae). (It will be appreciated that while the circuit of FIG. 4 and the examples discussed herein are in the context of an NPN current mirror test circuit, PNP transistors can be used as well with appropriate reversals of power supply and ground connections and polarities.) The degeneration, or ballast, resistor Re between the emitter electrode of transistor Q2 and circuit ground is normally set to zero, i.e., a short circuit, for initial characterization of transistor Q2.

The self-heating effect in this current mirror circuit with no emitter degeneration resistor (Re=0) can be characterized by increases in the current mirror ratio Iout/Iref which is dependent upon the input current Iref for different output bias voltages Vout. For example, with an output bias voltage Vout (Vout=Vce when Re=0) of one volt, there is no temperature rise in the power transistor Q2 while the current mirror ratio Iout/Iref is maintained over the entire current range. However, a self-heating effect begins as the output voltage Vout is increased. Such effect results in increases in the current mirror ratio accompanied by a reduction in the onset input current Iref (i.e., the input current Iref at which such current mirror ratio increases begin).

Compared to the conventional individual testing modes (voltage controlled and current controlled) as discussed above, this current mirror circuit technique provides advantages at low and high output bias voltages Vout, e.g., less than five volts and greater than twelve volts. One advantage is the ability to now quantify the self-heating effect at low bias voltages Vout. Conventional voltage controlled and current controlled methods do not produce abrupt decreases in current gain or negative resistance at low bias voltages Vout, even though some changes in the current gain or base emitter voltage may be taking place. However, using the current mirror circuit technique, such self-heating effects can be readily seen by corresponding increases, or errors, in the current mirror ratio Iout/Iref.

Figure 5:
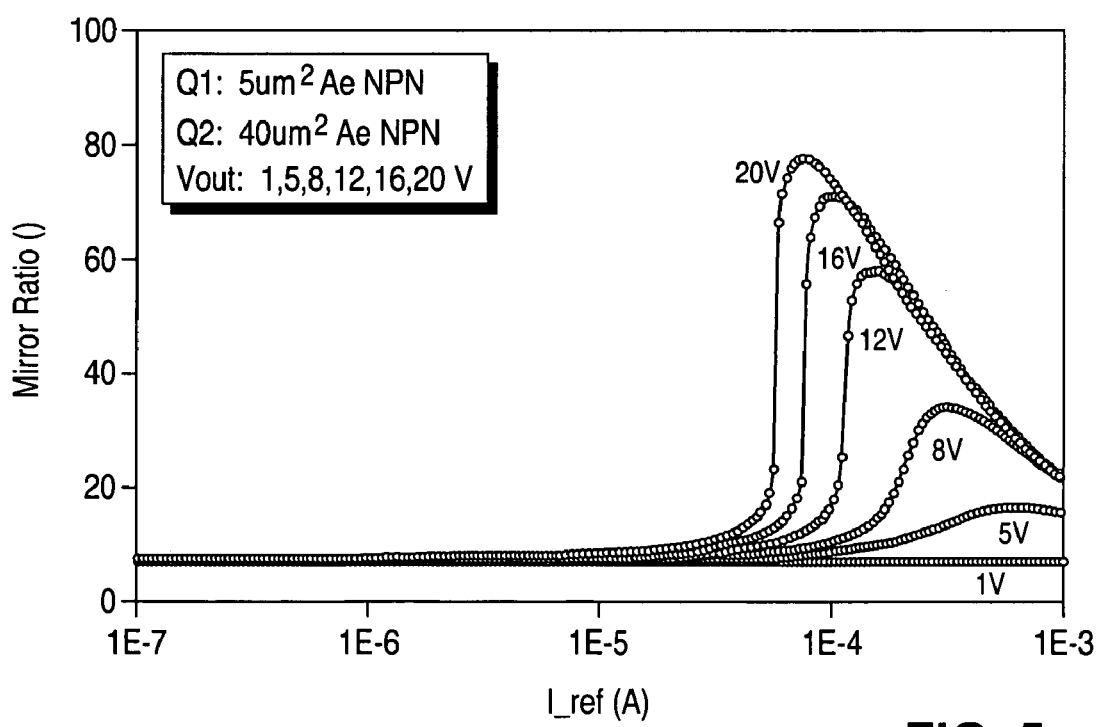
FIG. 5 is a graph of current mirror ratio versus reference current for the circuit of FIG. 4.
Figure 6:
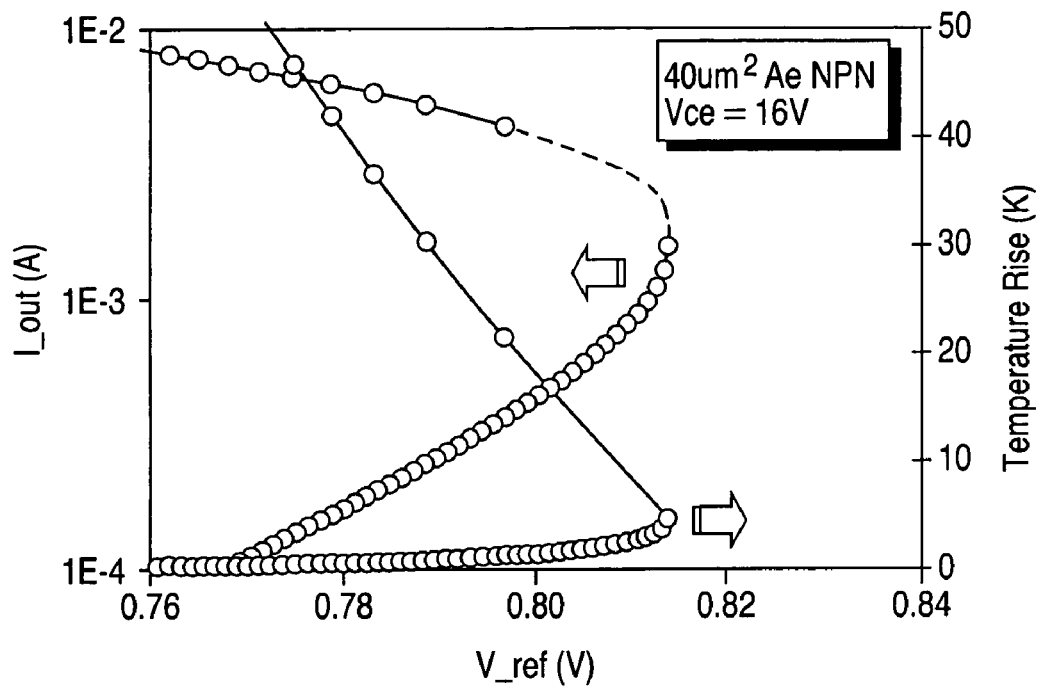
FIG. 6 is a graph of output current and temperature rise versus reference voltage for the circuit of FIG. 4.

Additionally, using the current mirror circuit technique, the DUT power transistor is not controlled by only a single fixed mode with respect to current or voltage at the onset of any self-heating effects. When the input current Iref approaches its value at which self-heating effects begin, both current and voltage in the base electrode of the power transistor being tested are varied simultaneously, particularly at high bias voltage Vout conditions where abrupt increases in a current mirror ratio can be seen (FIG. 5). Referring to FIG. 6, it can be seen that even though the basic behavior of the power transistor and a current mirror is similar to that in a current controlled mode for an individual transistor, abrupt changes in output current and average temperature nonetheless take place.

Figure 7:
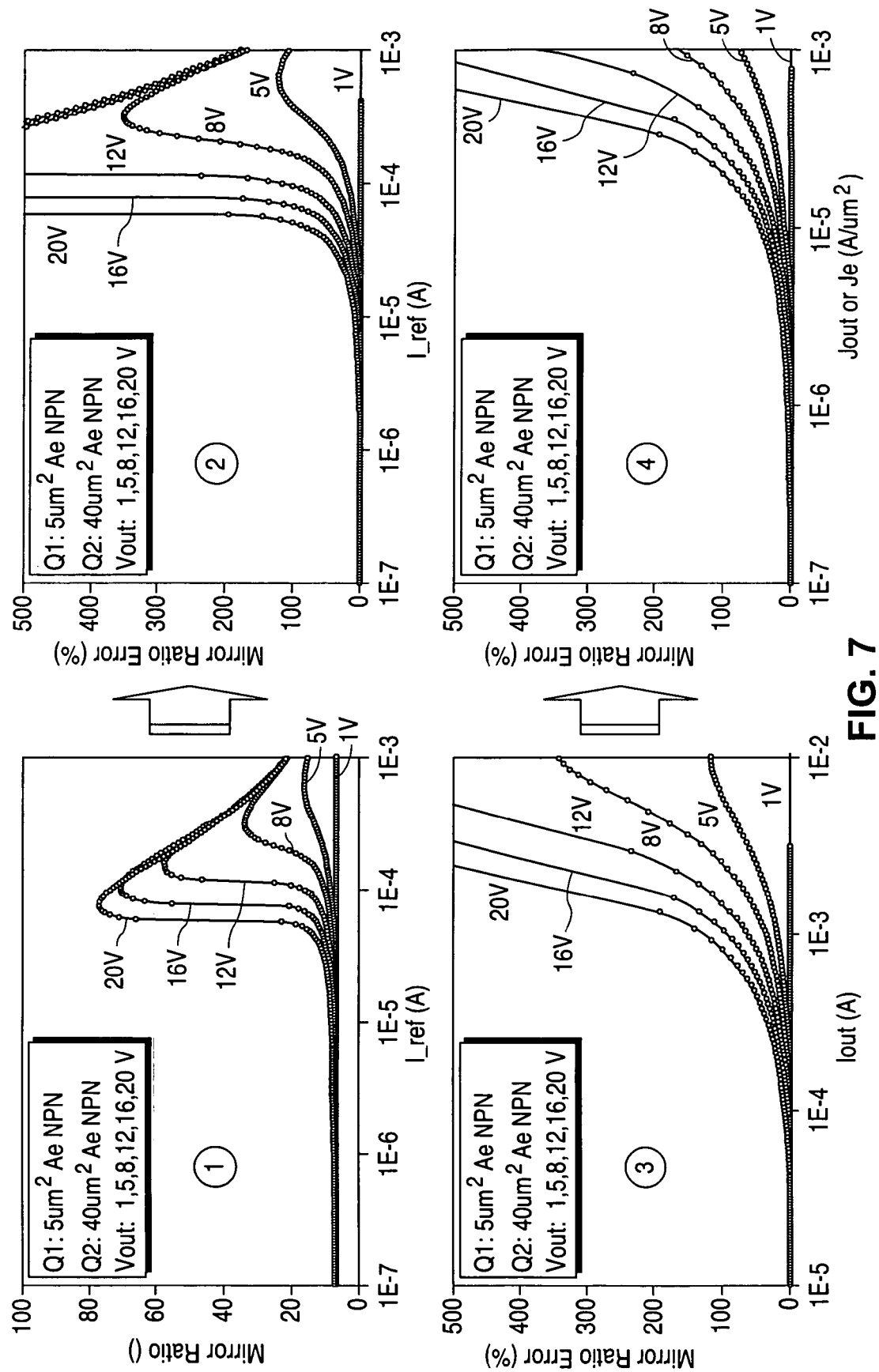
FIG. 7 is a set of related graphs of current mirror ratio and current mirror ratio error as a function of reference current, output current and current density for the circuit of FIG. 4.

Referring to FIG. 7, this technique for characterizing the SOA from the current mirror circuit of FIG. 4 can be better understood. As per graph 1, the current mirror ratio as a percentage is determined as a function of the input current Iref for various output bias voltages Vout. Then, as per graph 2, the current mirror ratio error as a percentage is computed, also as a function of the input current Iref, by taking the difference between each current mirror ratio Iout/Iref and a reference current mirror ratio (e.g., at an input current Iref of 100 nanoamperes at which self-heating effects are virtually nonexistent) divided by such reference current mirror ratio. As per graph 3, the current mirror ratio error as a percentage can also be plotted as a function of the output current Iout since the output current is equal to the input current Iref multiplied by the current mirror ratio. Lastly, as per graph 4, the current mirror ratio error as a percentage can also be expressed as a function of the output current density Jout, which is substantially equal to the emitter current density Je for large values of transistor current gains (beta), and is equal to the output current Iout divided by the emitter area Ae.

Figure 8:
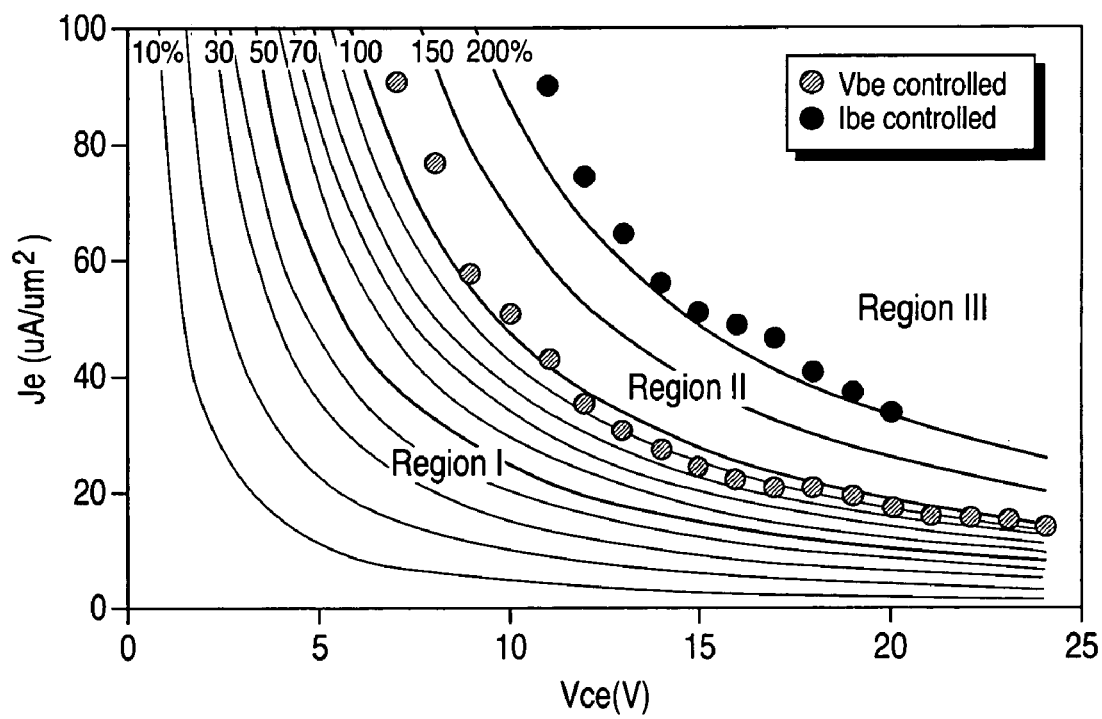
FIG. 8 is a graph of current density versus collector-emitter voltage based on the data points of FIGS. 5, 6 and 7.

Referring to FIG. 8, once these various data points have been established following the application of the various input current Iref values and output bias voltage Vout values, and measurements of the corresponding reference voltage Vref and output current Iout, a number of performance contours can be generated at in terms of emitter current density Je as a function of output voltage Vce (Vce=Vout when Re=0) for each current mirror ratio error. For example, as shown, such contours can be generated for current mirror ratio errors of 10%, 20%, 30%, and so on to 200%.

Figure 9:
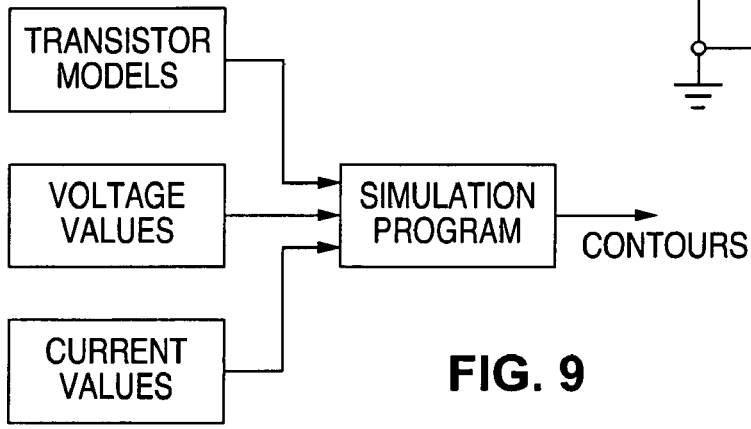
FIG. 9 is a functional block diagram illustrating how a BJT can be characterized using device simulations in accordance with another embodiment of the presently claimed invention.

Referring to FIG. 9, this characterization technique can be performed by simulating the test circuit of FIG. 4, e.g., as opposed to physically fabricating and testing such a circuit. Such circuit simulations and the computer programs (e.g., the various generations of the Simulation Program with Integrated Circuit Emphasis, also known as SPICE) used to perform them are very well known in the art and need not be described here in detail. Data corresponding to the models for the transistors to be characterized, along with data corresponding to the various circuit parameters (e.g., Vref, Iref, Vout, Iout), are provided to the simulation program which simulates the operation of the current mirror circuit of FIG. 4 and generates the various data points and contours as discussed above.

Based upon this set of contours, a number of characteristics become evident. In Region I, the power level is less than 0.4 milliwatts per square micrometer of emitter area and the current mirror error is less than 100%. In Region II, the power level is between 0.4 and 0.8 milliwatts per square micrometer, and the current mirror error is between 100% and 200%. In Region III, the power level is greater than 0.8 milliwatts per square micrometer, and the current mirror error is greater than 200%. Region III corresponds to the negative resistance region identified by current controlled mode of testing, while Region II corresponds to the thermal runaway region identified by voltage controlled mode testing. Region I, however, identifies a better quantified SOA for the transistor Q2, and with multiple contours corresponding to the various current mirror ratio errors for the various test conditions, the SOA for the transistor Q2 being tested can be specifically selected according to anticipated or desired device operating characteristics.

Figure 1A:
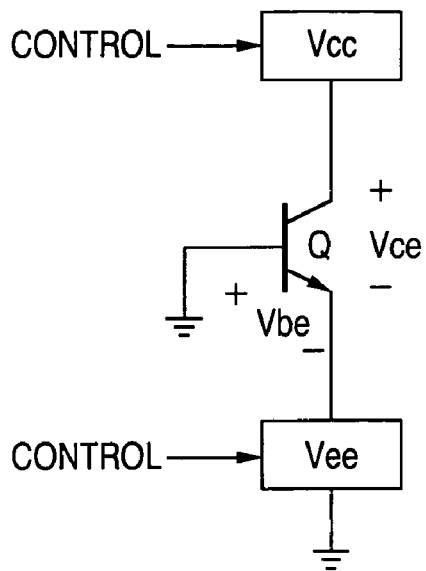
FIG. 1A is a schematic diagram of the test circuit for characterizing a BJT in a voltage controlled mode.
Figure 2A:
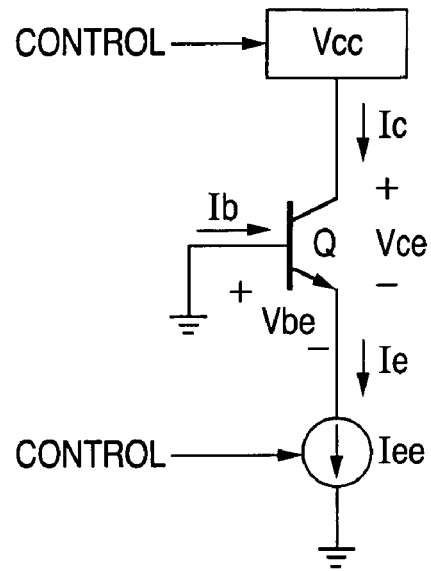
FIG. 2A is a schematic diagram of a test circuit for characterizing a BJT in a current controlled mode.
Figure 1B:
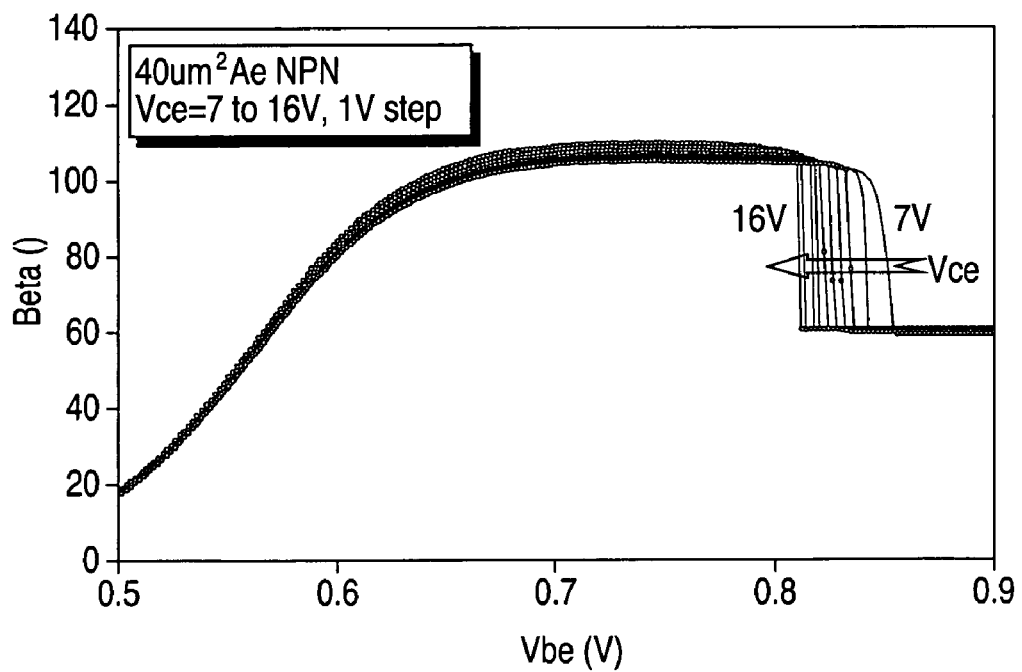
FIG. 1B is a graph of current gain versus base-emitter voltage for the transistor of FIG. 1A.
Figure 2B:
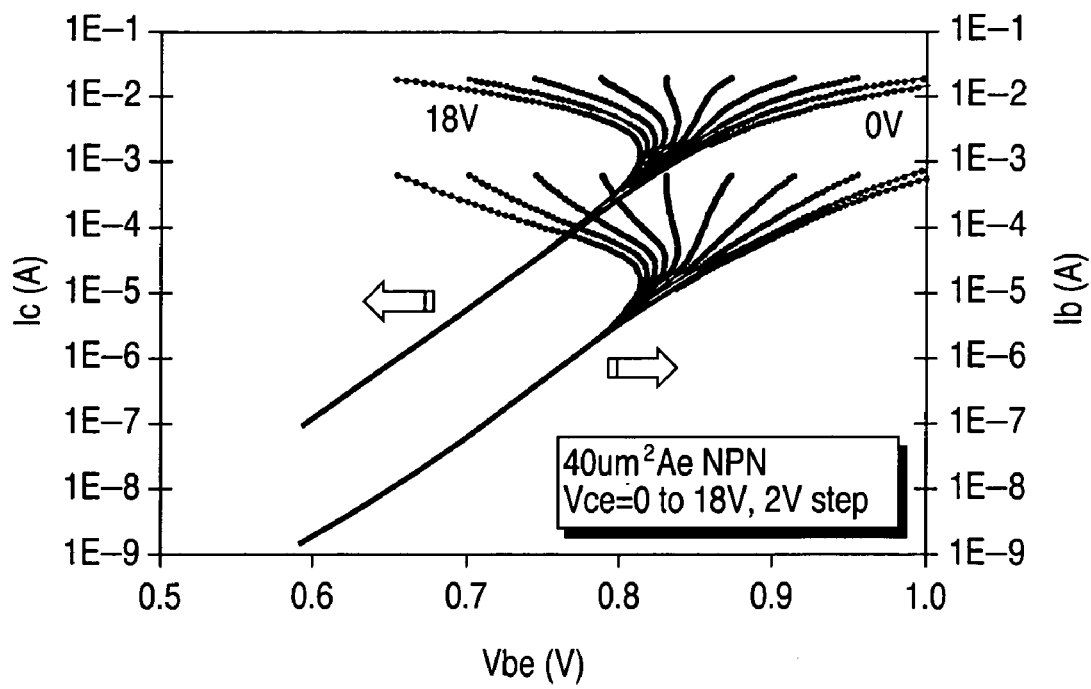
FIG. 2B is a graph of base and collector currents versus base-emitter voltage for the transistor of FIG. 2A.
Figure 3:
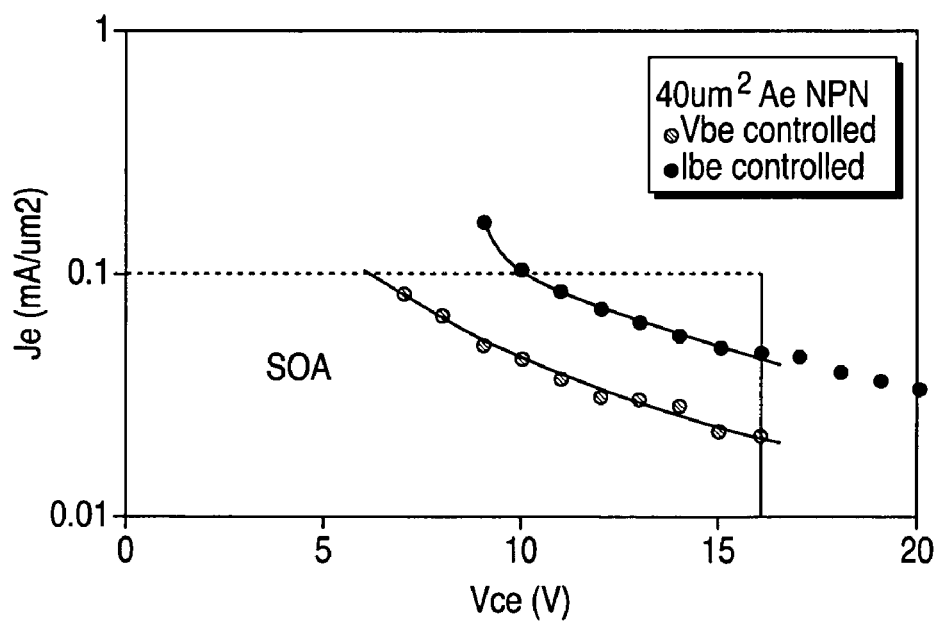
FIG. 3 is a graph of emitter current density versus collector-emitter voltage derived from the data points in FIGS. 1B and 2B.

Based upon the foregoing discussion, at least one significant advantage afforded by the presently claimed invention should be understood, i.e., improved quantification of the true thermal stability characteristic of the DUT. For example, for a power transistor with a current feedback loop operating at an emitter current density Je of 100 microamperes per square micrometer and an output voltage Vce of eight volts, a conventional current controlled test would indicate that such transistor was operating in a SOA (FIG. 3) without a negative resistance effect and was, therefore, thermally stable. However, when tested with a current mirror technique in accordance with the presently claimed invention, it becomes readily apparent that the current mirror ratio error for such transistor will be 150%, meaning that its current density Je will actually be somewhere in the range of 100–250 microamperes per square micrometer and will, therefore, be thermally unstable (FIG. 8). Hence, heretofore unknown thermally unstable operating conditions can be more readily and reliably predicted and avoided with more appropriate device or circuit design.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method for quantifying a plurality of safe operating regions within a safe operating area (SOA) for a bipolar junction transistor (BJT), comprising:

providing a current mirror circuit with mutually coupled first and second BJTs, wherein
said first BJT includes a base electrode, a collector electrode and an emitter electrode with an area,
said second BJT includes a base electrode, a collector electrode and an emitter electrode with an area, and
said second BJT emitter area is greater than said first BJT emitter area;

applying an inter-electrode voltage with a plurality of values to first and second ones of said second BJT electrodes;

applying a first current with a plurality of values to at least one of said first BJT electrodes;

measuring a plurality of values of a second current through one of said second BJT electrodes corresponding to a plurality of combinations of said pluralities of inter-electrode voltage and first current values;

computing a plurality of electrode current densities corresponding to a plurality of ratios of said plurality of second current values and said second BJT emitter electrode area;

computing a plurality of ratios of said second and first current values corresponding to at least a portion of said plurality of combinations of said pluralities of inter-electrode voltage and first current values;

computing a plurality of ratio errors corresponding to a plurality of differences between each one of said plurality of second and first current ratios and a reference current ratio; and generating a plurality of contours corresponding to said plurality of electrode current densities as functions of said plurality of inter-electrode voltage values for said plurality of ratio errors.

2. The method of claim 1, wherein said providing a current mirror circuit with mutually coupled first and second BJTs comprises providing first and second silicon-on-insulator BJTs.

3. The method of claim 1, wherein said applying an inter-electrode voltage with a plurality of values to first and second ones of said second BJT electrodes comprises applying said inter-electrode voltage to said second BJT collector and emitter electrodes.

4. The method of claim 1, wherein said applying a first current with a plurality of values to at least one of said first BJT electrodes comprises applying said first current to said first BJT collector electrode.

5. The method of claim 1, wherein said measuring a plurality of values of a second current through one of said second BJT electrodes corresponding to a plurality of combinations of said pluralities of inter-electrode voltage and first current values comprises measuring said plurality of values of said second current through said second BJT collector electrode.

6. The method of claim 1, wherein said computing a plurality of electrode current densities corresponding to a plurality of ratios of said plurality of second current values and said second BJT emitter electrode area comprises computing a plurality of emitter electrode current densities for said second BJT.

7. A method for quantifying a plurality of safe operating regions within a safe operating area (SOA) for a bipolar junction transistor (BJT), comprising:

providing a plurality of transistor model data for first and second BJTs, wherein
    said first BJT includes a base electrode, a collector electrode and an emitter electrode with an area,
    said second BJT includes a base electrode, a collector electrode and an emitter electrode with an area, and
    said second BJT emitter area is greater than said first BJT emitter area;

simulating a current mirror circuit with said plurality of transistor model data, wherein said first and second BJTs are mutually coupled;

simulating an application of an inter-electrode voltage with a plurality of values to first and second ones of said second BJT electrodes;

simulating an application of a first current with a plurality of values to at least one of said first BJT electrodes;

computing a plurality of values of a second current through one of said second BJT electrodes corresponding to a plurality of combinations of said pluralities of inter-electrode voltage and first current values;

computing a plurality of electrode current densities corresponding to a plurality of ratios of said plurality of second current values and said second BJT emitter electrode area;

computing a plurality of ratios of said second and first current values corresponding to at least a portion of said plurality of combinations of said pluralities of inter-electrode voltage and first current values;

computing a plurality of ratio errors corresponding to a plurality of differences between each one of said plurality of second and first current ratios and a reference current ratio; and generating a plurality of contours corresponding to said plurality of electrode current densities as functions of said plurality of inter-electrode voltage values for said plurality of ratio errors.

8. The method of claim 7, wherein said providing a plurality of transistor model data for first and second BJTs comprises providing a plurality of transistor model data for first and second silicon-on-insulator BJTs.

9. The method of claim 7, wherein said simulating an application of an inter-electrode voltage with a plurality of values to first and second ones of said second BJT electrodes comprises simulating an application of said inter-electrode voltage to said second BJT collector and emitter electrodes.

10. The method of claim 7, wherein said simulating an application of a first current with a plurality of values to at least one of said first BJT electrodes comprises simulating an application of said first current to said first BJT collector electrode.

11. The method of claim 7, wherein said computing a plurality of values of a second current through one of said second BJT electrodes corresponding to a plurality of combinations of said pluralities of inter-electrode voltage and first current values comprises computing said plurality of values of said second current through said second BJT collector electrode.

12. The method of claim 7, wherein said computing a plurality of electrode current densities corresponding to a plurality of ratios of said plurality of second current values and said second BJT emitter electrode area comprises computing a plurality of emitter electrode current densities for said second BJT.

* * * * *

UNITED STATES PATENT AND TRADEMARK OFFICE
CERTIFICATE OF CORRECTION

PATENT NO.   : 6,931,345 B1
DATED        : August 16, 2005
INVENTOR(S)  : Jonggook Kim et al.

It is certified that error appears in the above-identified patent and that said Letters Patent is hereby corrected as shown below:

Column 1,
Line 58, delete "Iee" and insert -- Iee --.

Column 4,
Lines 25 and 35, delete "Iout" and insert -- Iout --.

Column 5,
Lines 32, 39 and 45, delete "Iout" and insert -- Iout --.
Line 61, delete "(Iout)" and insert -- (Iout) --.

Signed and Sealed this

Eleventh Day of October, 2005

JON W. DUDAS
*Director of the United States Patent and Trademark Office*